United States Patent [19]

Breininger et al.

[11] 4,400,436

[45] * Aug. 23, 1983

[54] DIRECT ELECTROLESS DEPOSITION OF CUPROUS OXIDE FILMS

[75] Inventors: J. Shannon Breininger, Gibsonia; Charles B. Greenberg, Murrysville, both of Pa.

[73] Assignee: PPG Industries, Inc., Pittsburgh, Pa.

[*] Notice: The portion of the term of this patent subsequent to Oct. 9, 1996 has been disclaimed.

[21] Appl. No.: 238,732

[22] Filed: Feb. 27, 1981

Related U.S. Application Data

[63] Continuation of Ser. No. 164,110, Jun. 30, 1980, Pat. No. 4,315,055, which is a continuation of Ser. No. 755,369, Dec. 29, 1976, abandoned.

[51] Int. Cl.$^3$ .................. B32B 17/06; C03C 17/36
[52] U.S. Cl. .................. 428/434; 427/301; 427/305; 428/702; 428/936
[58] Field of Search .............. 427/305, 306, 301, 435, 427/437, 443.1, 443.2; 106/1.26; 428/434, 702, 936

[56] References Cited

U.S. PATENT DOCUMENTS

| | | | |
|---|---|---|---|
| 2,532,283 | 12/1950 | Brenner et al. | 427/305 |
| 2,532,284 | 12/1950 | Brenner et al. | 427/305 |
| 2,956,900 | 10/1960 | Carlson et al. | 427/306 |
| 3,377,174 | 4/1968 | Torigai et al. | 427/404 |
| 3,457,138 | 7/1969 | Miller | 427/305 X |
| 3,671,291 | 6/1972 | Miller et al. | 427/168 |
| 3,846,152 | 11/1974 | Franz | 428/333 |
| 3,920,864 | 11/1975 | Greenberg et al. | 427/169 |
| 3,944,440 | 3/1976 | Franz | 427/305 X |
| 3,978,272 | 8/1976 | Donley | 428/434 |
| 4,170,461 | 10/1979 | Breininger et al. | 65/60 D |
| 4,315,055 | 2/1982 | Breininger et al. | 427/304 X |

*Primary Examiner*—Evan K. Lawrence
*Attorney, Agent, or Firm*—Donna L. Seidel

[57] ABSTRACT

Cuprous oxide films are directly deposited by chemical reduction from an aqueous solution of a copper salt, a complexing agent and a reducing agent maintained at a critical pH of at least about 12.9.

9 Claims, No Drawings

DIRECT ELECTROLESS DEPOSITION OF CUPROUS OXIDE FILMS

This is a continuation of application Ser. No. 164,110 filed June 30, 1980 now U.S. Pat. No. 4,315,055 which is a continuation of application Ser. No. 755,369 filed Dec. 29, 1976, abandoned.

BACKGROUND OF THE INVENTION

1. Field of the Invention

The present invention relates broadly to methods of preparing metal oxide films and more particularly to an electroless method for the direct deposition of cuprous oxide.

2. Description of the Prior Art

Metal coated articles have been produced by various well-known electroless deposition techniques which involve contacting a receptive surface with a metal salt and a reducing agent to form a metal film. Autocatalytic techniques wherein the metal salt and reducing agent are present in a single solution and react upon contact with a catalytic surface are described in U.S. Pat. No. 2,532,283 and No. 2,532,284 for the deposition of cobalt and U.S. Pat. No. 2,956,900 for the deposition of nickel. Exhaustive techniques wherein the metal salt and reducing agent react rapidly upon contact with each other and so are applied to the surface to be coated in separate solutions are described in U.S. Pat. No. 3,671,291. The methods described in U.S. Pat. No. 3,671,291 involve contacting a reactive substrate with an acidic metal salt solution and an alkaline reducing solution.

Such electroless coating techniques have been successfully employed for the direct deposition of thin, transparent metallic films of iron, cobalt, nickel, copper, silver and mixtures thereof on non-metallic substrates, particularly large sheets of glass. The films so produced have suitable transmittance, reflectance and uniform thickness to provide coated articles with important solar energy control characteristics and a uniform aesthetic appearance.

In U.S. Pat. No. 3,457,138, an improved electroless method for depositing copper films on glass is disclosed. The method involves contacting an activated glass surface with an alkaline aqueous solution of a copper salt, a reducing agent, and a tartrate salt in the presence of nickel or cobalt. The pH of the solution may be from about 8 to 12, preferably from about 9 to 11. Copper film forming solutions having acidic pH are avoided since under acidic conditions the copper film formation does not proceed satisfactorily.

Electrolessly deposited metal films may be oxidized in order to obtain optical and spectral properties which differ from the properties of the initially deposited metal films. In U.S. Pat. No. 3,846,152, articles with selective reflectance and transmittance properties for radiation over an extended spectral range are disclosed. Such articles are produced by coating a substrate with a first metal film of silver, iron, cobalt, chromium or nickel; coating with a second metal film of copper or iron by electroless deposition using an alkaline aqueous solution of a metal salt and reducing agent; and heating to convert the second metal film to metal oxide. In U.S. Pat. No. 3,920,864, a method is disclosed for treating a copper-coated article with a solution which results in partial replacement of the copper by silver. The copper-silver composite film is subsequently oxidized by exposure to moist air.

As an alternative to the subsequent oxidation of electrolessly deposited metal films, a method is disclosed in U.S. Pat. No. 3,978,272 for the direct deposition of metal oxide films. Such films are deposited by spraying a solution of a metal compound onto the substrate which is sufficiently hot to thermally decompose the metal compound thus forming a metal oxide film by pyrolysis.

SUMMARY OF THE INVENTION

In accordance with the present invention, a cuprous oxide film is deposited by chemical reduction from an electroless coating solution of a copper salt and a reducing agent; the pH of the solution being maintained above about 12.9. The criticality of the pH of the solution apparently involves complexation of the cupric ions by hydroxide ions. An additional complexing agent acts as a secondary complexer to prevent bulk precipitation of copper hydroxide.

Cuprous oxide films according to the present invention may be deposited on metallic substrates such as copper or on nonmetallic substrates which can be made receptive of such a coating. Glass substrates can be coated with cuprous oxide films according to the present invention after the glass surface is activated such as by deposition of a precursory silver or copper metallic film.

Cuprous oxide films electrolessly deposited on a silver-activated glass surface provide coated glass articles which appear blue-green at the film surface, yellow-green at the glass surface and greenish by transmission.

DESCRIPTION OF THE PREFERRED EMBODIMENTS

A preferred embodiment of the present invention is the electroless deposition of cuprous oxide films onto a glass substrate, clear soda-lime-silica glass being preferred.

Large sheets of glass of the desired thickness, preferably about ⅛ to ¼ inch are cleaned by conventional procedures, preferably by a blocking operation carried out with rotating felt blocks which gently abrade the surface of the glass with an aqueous slurry of a light abrasive such as cerium oxide. A suitable continuous line apparatus for washing, rinsing and sweeping the surface is shown in U.S. Pat. No. 3,723,158.

The clean surface to be coated is contacted with a dilute aqueous solution of a sensitizing agent, preferably 0.01 to 1.0 grams per liter of stannous chloride, to render the surface receptive to a coating.

In a most preferred embodiment, a thin catalytic silver film is deposited on the sensitized surface, preferably by contacting the surface with silver ions and a reducing agent. The silver ions are preferably present in an alkaline aqueous solution comprising about 0.15 to 15 grams per liter silver nitrate and about 0.45 to 60 milliliters per liter ammonium hydroxide (28 to 30 percent aqueous solution). The reducing agent is preferably applied substantially simultaneously in an aqueous solution of about 0.5 to 10 grams per liter reducing agent, preferably dextrose. The catalytic silver film is preferably of sufficient thickness to lower the luminous transmittance from about 85 to 95 percent for clear glass alone to about 40 to 80 percent. It is important that the silver film be substantially free from silver oxide as the presence of the oxide appears to favor deposition of copper metal in the subsequent coating step. Therefore, if it is likely that the silver film has undergone significant oxidation prior to the cuprous oxide coating step, it is preferred to rinse the silver-activated surface with a dilute solution of an oxide inhibitor such as sodium borohydride, ammonium polysulfide, formaldehyde, or preferably sodium thiosulfate.

The silver-activated surface is contacted with a strongly alkaline electroless plating bath comprising a copper salt and a reducing agent. The plating bath preferably also comprises a complexing agent. The preferred copper salt is copper sulfate. Formaldehyde, particularly as a 37 percent aqueous solution, is a preferred reducing agent, although other common reducing agents such as dextrose and hydrazine sulfate can be used. Gluconic, citric, malic and lactic acids and their salts are suitable complexing agents; however, Rochelle salt, sodium potassium tartrate, is preferred. The pH of the solution is maintained above about 12.9 with a sufficient quantity of common alkali, preferably sodium hydroxide.

In a most preferred embodiment, a silver-activated glass substrate is contacted for several minutes at ambient temperature with an aqueous solution comprising per liter about 2–5 grams copper sulfate
15–40 milliliters formaldehyde solution
1–5 grams Rochelle salt and sufficient sodium hydroxide to maintain the pH of the solution above about 12.9. Contacting a silver-activated glass substrate having a luminous transmittance of about 50 percent with such a solution for sufficient time to deposit a cuprous oxide film of sufficient thickness to lower the luminous transmittance to about 10 to 40 percent results in a cuprous oxide coated article which appears blue-green at the film surface, yellow-green at the glass surface and greenish by transmission.

The most preferred articles prepared in accordance with the foregoing method have, in addition to a luminous transmittance of about 10 to 40 percent, a luminous reflectance of about 10 to 40 percent from the film surface and a luminous reflectance of about 30 to 60 percent from the glass surface.

The present invention will be more fully understood from the descriptions of specific examples which follow.

EXAMPLE I

Flat sheets of clear soda-lime-silica glass are cleaned and sensitized with an aqueous solution of 0.5 gram per liter stannous chloride. The sensitized surface is contacted for 15 seconds at ambient temperature with an alkaline aqueous solution containing 2.1 grams per liter silver nitrate, 10 milliliters per liter ammonium hydroxide, and 0.32 grams per liter sodium hydroxide and a solution of 2.6 grams per liter dextrose to deposit a thin catalytic silver film.

The silver-activated surface is contacted for 5 minutes at room temperature with a solution containing 3.8 grams per liter copper sulfate, 29 milliliters per liter formaldehyde (37 percent assay), 3 grams per liter Rochelle salt and sufficient sodium hydroxide to bring the pH to 12.9.

The resultant film is part metallic copper and part cuprous oxide as identified by X-ray diffraction.

EXAMPLE II

Glass substrates are cleaned, sensitized and contacted for 25 seconds with silver and reducing solutions as in Example I. The silver-activated surface, which has a luminous transmittance of 49 percent, is rinsed with a solution of 0.1 gram per liter sodium thiosulfate and contacted for three and a half minutes at ambient temperature with a solution containing 3.8 grams per liter copper sulfate, 29 milliliters per liter formaldehyde, 3 grams per liter Rochelle salt and 25 grams per liter sodium hydroxide to bring the pH to about 13.1.

A uniform cuprous oxide film is deposited. The coated article appears blue-green at the film surface with a luminous reflectance of 30 percent, yellow-green at the glass surface with a luminous reflectance of 44 percent, and greenish by transmission with a luminous transmittance of 24 percent.

EXAMPLE III

Glass substrates are cleaned, sensitized, and activated as in Example I and rinsed as in Example II. The silver-activated surface is contacted for 2 minutes at ambient temperature with a solution containing 3.8 grams per liter copper sulfate, 29 milliliters per liter formaldehyde, 3 grams per liter Rochelle salt and sufficient sodium hydroxide to bring the pH to 13.5.

A uniform, cuprous oxide film is deposited. The resultant coated article appears blue-green at the film surface, yellow-green at the glass surface and greenish by transmission. The reflectance from the film surface is 20 percent, the reflectance from the glass surface is 47 percent and the luminous transmittance is 37 percent.

EXAMPLE IV

A clean, sensitized glass substrate is contacted for about 30 seconds with the silver activation solutions and rinsed as in Example II. The silver-activated substrate, which has a luminous transmittance of 46.5 percent, is contacted for 3 minutes with a solution containing 3.8 grams per liter copper sulfate, 29 milliliter per liter formaldehyde, 3 grams per liter Rochelle salt and sufficient sodium hydroxide to bring the pH to 13.7.

A uniform cuprous oxide film is deposited. The coated article has luminous transmittance of 24.7 percent, luminous reflectance from the coated surface of 28.9 percent, and luminous reflectance from the glass side of 49.8 percent. The color appearance of the coated article, according to the conventions of the Inter-Society Color Council, National Bureau of Standards (see 15CC-NBS Color-Name Charts Supplement to NBS Circular 553), is light olive by transmission, light bluish green by reflection from the coated surface, and grayish greenish yellow by reflection from the glass surface.

Various modifications of the present invention will become known to those skilled in the art. The coating method of the present invention may be useful with nonmetallic substrates other than glass, particularly in the field of electronics. Such alternatives fall within the spirit of the present invention and are within its scope as defined by the following claims.

We claim:

1. A wet chemical method for the direct deposition of cuprous oxide onto a surface of a receptive substrate comprising the steps of:
    (a) preparing an electroless plating solution comprising a copper salt and a reducing agent;

(b) adding to said solution sufficient alkali to bring the pH of the solution to at least about 12.9; and (c) contacting the surface to be coated with the solution for sufficient time to deposit a film consisting essentially of cuprous oxide to a desired thickness.

2. The method according to claim 1, wherein the electroless plating solution further comprises a complexing agent.

3. The method according to claim 2, wherein the surface is rinsed with a solution of a chemical compound capable of rendering the surface substantially free of metal oxides other than cuprous oxide before it is contacted with the electroless plating solution.

4. A wet chemical method for the direct deposition of cuprous oxide onto a surface of a glass substrate comprising the steps of:

(a) cleaning a surface of the substrate;
(b) sensitizing the surface;
(c) activating the surface;
(d) contacting the activated surface with an electroless plating solution comprising:
  (1) a copper salt;
  (2) a complexing agent;
  (3) a reducing agent; and
  (4) sufficient alkali to bring the pH of the solution to at least about 12.9 for sufficient time to deposit a film consisting essentially of cuprous oxide to a desired thickness.

5. The method according to claim 4, wherein the surface is activated by contacting the surface with a silver salt, a complexing agent and a reducing agent to deposit a catalytic silver film.

6. The method according to claim 4 wherein the activated surface is contacted with an electroless plating solution wherein the copper salt comprises 2-5 grams per liter copper sulfate; the reducing agent comprises 15-40 milliliters per liter formaldehyde solution; the complexing agent comprises 1-5 grams per liter Rochelle salt; and the alkali comprises sufficient alkali metal hydroxide to bring the pH of the solution to at least about 12.9.

7. The method according to claim 6, wherein the activated surface is contacted with the solution at room temperature for a period of about 1 to 5 minutes.

8. The method according to claim 7, wherein the silver-activated substrate has a luminous transmittance of about 40 to 80 percent and is contacted for sufficient time to deposit cuprous oxide to sufficient thickness to lower the luminous transmittance to about 10 to 40 percent.

9. An article of manufacture prepared according to the method of claim 8.

* * * * *